(12) United States Patent
Hong et al.

(10) Patent No.: US 10,685,732 B2
(45) Date of Patent: Jun. 16, 2020

(54) SEMICONDUCTOR MEMORY DEVICE AND OPERATING METHOD

(71) Applicant: SK hynix Inc., Gyeonggi-do (KR)

(72) Inventors: Yong Hwan Hong, Gyeonggi-do (KR); Byung Ryul Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 50 days.

(21) Appl. No.: 16/123,514

(22) Filed: Sep. 6, 2018

(65) Prior Publication Data

US 2019/0237153 A1 Aug. 1, 2019

(30) Foreign Application Priority Data

Feb. 1, 2018 (KR) ........................ 10-2018-0012929

(51) Int. Cl.
*G11C 29/18* (2006.01)
*G11C 29/44* (2006.01)
*G11C 16/04* (2006.01)
*H01L 27/11556* (2017.01)
*H01L 27/11582* (2017.01)
*G11C 16/08* (2006.01)

(52) U.S. Cl.
CPC .......... *G11C 29/44* (2013.01); *G11C 16/0408* (2013.01); *G11C 16/0466* (2013.01); *G11C 29/18* (2013.01); *H01L 27/11556* (2013.01); *H01L 27/11582* (2013.01); *G11C 16/0483* (2013.01); *G11C 16/08* (2013.01); *G11C 2029/1802* (2013.01); *G11C 2029/1806* (2013.01)

(58) Field of Classification Search
CPC ..... G11C 29/44; G11C 29/18; G11C 16/0408; G11C 16/08; G11C 16/0483; G11C 2029/1802; G11C 2029/1806; G11C 29/76; G11C 16/0466; G11C 29/14; G11C 29/26; H01L 27/11582; H01L 27/11556
USPC .......................................................... 714/723
See application file for complete search history.

(56) References Cited

U.S. PATENT DOCUMENTS

| | | | | |
|---|---|---|---|---|
| 8,601,331 B2 * | 12/2013 | Nobunaga | ............... | G11C 29/76 714/710 |
| 2002/0176310 A1 * | 11/2002 | Hilbert | ................... | G11C 29/70 365/230.06 |
| 2004/0128593 A1 * | 7/2004 | Grinchuk | ............... | G11C 29/44 714/710 |

(Continued)

FOREIGN PATENT DOCUMENTS

| KR | 1020120132820 | 12/2012 |
|---|---|---|
| KR | 1020160136002 | 11/2016 |

*Primary Examiner* — Albert Decady
*Assistant Examiner* — Enam Ahmed
(74) *Attorney, Agent, or Firm* — IP & T Group LLP

(57) ABSTRACT

A semiconductor memory device includes a memory cell array, a read/write circuit, and a control logic. The memory cell array includes a plurality of memory blocks. The read/write circuit performs a read/write operation on a selected page of the memory cell array. The address decoder stores bad block marking data on each of the plurality of memory blocks, and outputs the bad block marking data in response to an address signal. The control logic controls the read/write circuit to test whether a defect has occurred in the plurality of memory blocks, and controls the address decoder to store, as the bad block marking data, a test result representing whether the defect has occurred in the plurality of memory blocks.

15 Claims, 13 Drawing Sheets

(56) References Cited

U.S. PATENT DOCUMENTS

| | | | |
|---|---|---|---|
| 2005/0283657 A1* | 12/2005 | Nishihara | G11C 29/76 714/6.13 |
| 2008/0285347 A1* | 11/2008 | Byeon | G11C 29/76 365/185.09 |
| 2011/0154503 A1* | 6/2011 | Stewart | G06F 21/125 726/26 |
| 2014/0085982 A1* | 3/2014 | Asaoka | G11C 16/06 365/185.17 |
| 2017/0184662 A1* | 6/2017 | Varadarajan | G11C 29/44 |
| 2017/0330635 A1* | 11/2017 | Shepard | G11C 29/76 |

* cited by examiner

SEMICONDUCTOR MEMORY DEVICE AND OPERATING METHOD

CROSS-REFERENCE TO RELATED APPLICATION

The present application claims priority to Korean patent application number 10-2018-0012929, filed on Feb. 1, 2018, which is incorporated herein by reference in its entirety.

BACKGROUND

1. Field of Invention

The present disclosure generally relates to an electronic device, and more particularly, to a semiconductor memory device and an operating method thereof.

2. Description of Related Art

Memory devices may be formed in a two-dimensional structure in which strings are arranged horizontally to a semiconductor substrate, or be formed in a three-dimensional structure in which strings are arranged vertically to a semiconductor substrate. A three-dimensional semiconductor device is a memory device devised in order to overcome the limit of degree of integration in two-dimensional semiconductor devices, and may include a plurality of memory cells vertically stacked on a semiconductor substrate.

SUMMARY

Embodiments provide a semiconductor memory device capable of reducing test cost and test time.

Embodiments also provide an operating method of a semiconductor memory device capable of reducing test cost and test time.

In accordance with an aspect of the present disclosure, there is provided a semiconductor memory device including: a memory cell array configured to include a plurality of memory blocks; a read/write circuit configured to perform a read/write operation on a selected page of the memory cell array; an address decoder configured to store bad block marking data on each of the plurality of memory blocks, and output the bad block marking data in response to an address signal; and a control logic configured to control the read/write circuit to test whether a defect has occurred in the plurality of memory blocks, and control the address decoder to store, as the bad block marking data, a test result representing whether the defect has occurred in the plurality of memory blocks.

The memory cell array may include a repair area and a main area, which each includes at least one memory block.

The control logic may generate bad block information by collecting the bad block marking data, and generate repair mapping information, based on the bad block information.

The memory cell array may include an extra area including at least one memory block. The control logic may control the read/write circuit to program at least one of the bad block information and the repair mapping information in a memory block of the extra area.

The control logic may control the read/write circuit to back up at least one of the bad block information and the repair mapping information into a memory block of the main area.

In accordance with an aspect of the present disclosure, there is provided a method for operating a semiconductor memory device including a plurality of memory blocks, the method including: performing bad block marking on each of the plurality of memory blocks; generating bad block information, based on a result of the bad block marking; generating repair mapping information, based on the bad block information; and programming at least one of the bad block information and the repair mapping information in at least one of the plurality of memory blocks.

The performing of the bad block marking may include: detecting whether a defect has occurred in a selected memory block among the plurality of memory blocks; and updating data of a bad block latch corresponding to the selected memory block, based on a result obtained by detecting whether the defect has occurred in the selected memory block.

The bad block latch may be included in an address decoder of the semiconductor memory device.

In the generating of the bad block information, the bad block information may be generated by collecting data stored in the bad block latch.

The plurality of memory blocks may be distinguished to belong to any one of a repair area, an extra area, and a main area. In the generating of the repair mapping information, the repair mapping information may be generated by mapping at least one memory block having a defect among memory blocks belonging to the extra area and the main area to a memory block belonging to the repair area.

The generating of the repair mapping information may include: generating repair mapping information on memory blocks belonging to the extra area; and generating repair mapping information on memory blocks belonging to the main area.

In accordance with an aspect of the present disclosure, there is provided a method for operating a semiconductor memory device including a plurality of memory blocks, the method including: loading a previous bad block marking result backed up into at least one memory block among the plurality of memory blocks; performing bad block marking on each of the plurality of memory blocks; generating bad block information, based on a result of the bad block marking; generating repair mapping information, based on the bad block information; backing up at least one of the bad block information and the repair mapping information into at least one of the plurality of memory blocks; and programming at least one of the bad block information and the repair mapping information in at least one of the plurality of memory blocks.

The plurality of memory blocks may be distinguished to belong to any one of a repair area, an extra area, and a main area. In the backing up of the at least one of the bad block information and the repair mapping information into at least one of the plurality of memory blocks, at least one of the bad block information and the repair mapping information may be normal-programmed in a memory block belonging to the main area.

The loading of the previous bad block marking result may include: reading the bad block information programmed in the main area; and storing, in a bad block latch, a bad block marking result included in the read bad block information.

The plurality of memory blocks may be distinguished to belong to any one of a repair area, an extra area, and a main area. In the programming of at least one of the bad block information and the repair mapping information in at least one of the plurality of memory blocks, at least one of the bad block information and the repair mapping information may be CAM-programmed in a memory block belonging to the extra area.

In accordance with an aspect of the present disclosure, there is provided a memory device including: a storage circuit configured to access a plurality of memory blocks included therein; and a control circuit configured to: perform a bad block marking operation to the memory blocks; generate bad block marking data representing a defective memory block among the memory blocks as a result of the bad block marking operation; perform a repair operation to the defective memory block based on the bad block marking data; and control the storage circuit to store the bad block marking data and repair mapping information, which is a result of the repair operation, into a normal one among the memory blocks.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
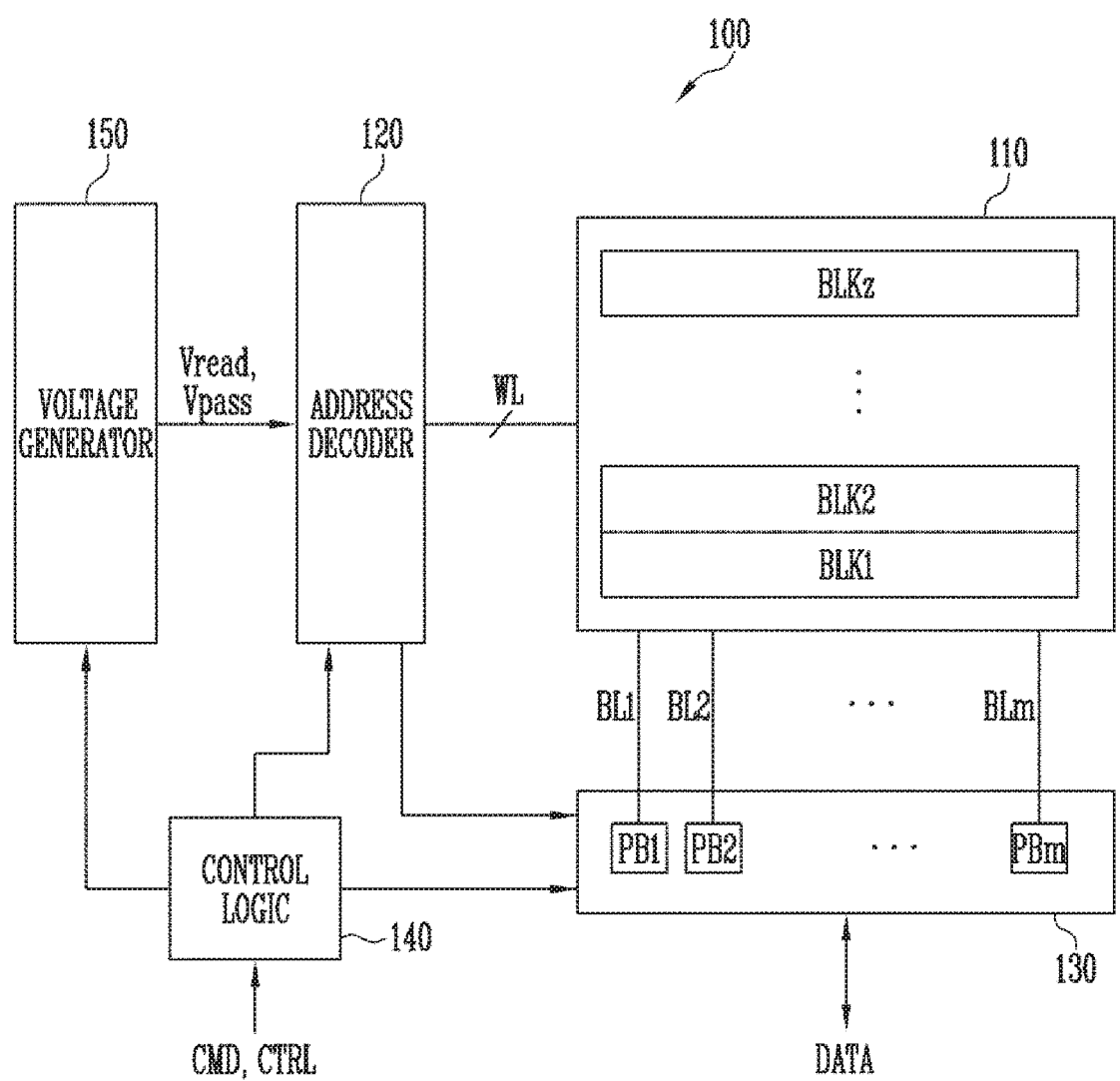
FIG. 1 is a block diagram illustrating a semiconductor memory device in accordance with an embodiment of the present disclosure.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Hereinafter, exemplary embodiments of the present disclosure will be described in detail with reference to the accompanying drawings. The same reference numerals are used to designate the same elements as those shown in other drawings. In the following descriptions, only portions necessary for understanding operations in accordance with the exemplary embodiments may be described, and descriptions of the other portions may be omitted so as to not obscure important concepts of the embodiments.

FIG. 1 is a block diagram illustrating a semiconductor memory device in accordance with an embodiment of the present disclosure.

Referring to FIG. 1, the semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130 through bit lines BL1 to BLm. Each of the plurality of memory blocks BLK1 to BLKz includes a plurality of memory cells. In an embodiment, the plurality of memory cells are nonvolatile memory cells, and may be configured as nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Furthermore, each of the plurality of memory cells included in the memory cell array 110 may store data of at least one bit. In an embodiment, each of the plurality of memory cells included in the memory cell array 110 may be a single-level cell (SLC) that stores data of one bit. In another embodiment, each of the plurality of memory cells included in the memory cell array 110 may be a multi-level cell (MLC) that stores data of two bits. In still another embodiment, each of the plurality of memory cells included in the memory cell array 110 may be a triple-level cell (TLC) that stores data of three bits. In still another embodiment, each of the plurality of memory cells included in the memory cell array 110 may be a quad-level cell (QLC) that stores data of four bits. In some embodiments, the memory cell array 110 may include a plurality of memory cells that each stores data of five or more bits.

The address decoder 120, the read/write circuit 130, the control logic 140, and the voltage generator 150 operate as a peripheral circuit that drives the memory cell array 110. The address decoder 120 is coupled to the memory cell array 110 through the word lines WL. The address decoder 120 is configured to operate in response to the control of the control logic 140. The address decoder 120 receives an address through an input/output buffer (not shown) provided in the semiconductor memory device 100.

The address decoder 120 is configured to decode a block address in the received address. The address decoder 120 selects at least one memory block according to the decoded block address. In a read voltage application operation during a read operation, the address decoder 120 applies a read voltage Vread generated by the voltage generator 150 to a selected word line in the selected memory block, and applies a pass voltage Vpass to the other unselected word lines. In a program verify operation, the address decoder 120 applies a verify voltage generated by the voltage generator 150 to the selected word line in the selected memory block, and applies the pass voltage Vpass to the other unselected word lines.

The address decoder 120 is configured to decode a column address in the received address. The address decoder 120 transmits the decoded column address to the read/write circuit 130.

Read and program operations of the semiconductor memory device 100 are performed in units of pages. An address received in a request of the read operation and the program operation includes a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The read/write circuit 130 may operate as a "read circuit" in a read operation of the memory cell array 110, and operate as a "write circuit" in a write operation of the memory cell array 110. The plurality of page buffers PB1 to PBm are coupled to the memory cell array 110 through the bit lines BL1 to BLm. In order to sense threshold voltages of memory cells in the read operation and the program verify operation, the plurality of page buffers PB1 to PBm sense a change in amount of current flowing depending on a program state of a corresponding memory cell while continuously supplying sensing current to bit lines coupled to the memory cells, and latch the sensed change as sensing data. The read/write circuit 130 operates in response to page buffer control signals output from the control logic 140.

In the read operation, the read/write circuit 130 temporarily stores read data by sensing data of a memory cell and then outputs data DATA to the input/output buffer (not shown) of the semiconductor memory device 100. In an exemplary embodiment, the read/write circuit 130 may include a column selection circuit, and the like, in addition to the page buffers (or page registers).

The control logic 140 is coupled to the address decoder 120, the read/write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. Also, the control logic 140 outputs a control signal for controlling sensing node precharge potential levels of the plurality of page buffers PB1 to PBm. The control logic 140 may control the read/write circuit 130 to perform the read operation of the memory cell array 110.

In the read operation, the voltage generator 150 generates the read voltage Vread and the pass voltage Vpass in response to a control signal output from the control logic 140. In order to generate a plurality of voltages having various voltage levels, the voltage generator 150 may include a plurality of pumping capacitors for receiving an internal power voltage, and generate a plurality of voltages by selectively activating the plurality of pumping capacitors under the control of the control logic 140.

The address decoder 120, the read/write circuit 130, and the voltage generator 150 may serve as a "peripheral circuit" for performing a read operation, a write operation, and an erase operation on the memory cell array 110. The peripheral circuit performs the read operation, the write operation, and the erase operation on the memory cell array 110 under the control of the control logic 140.

Figure 2:
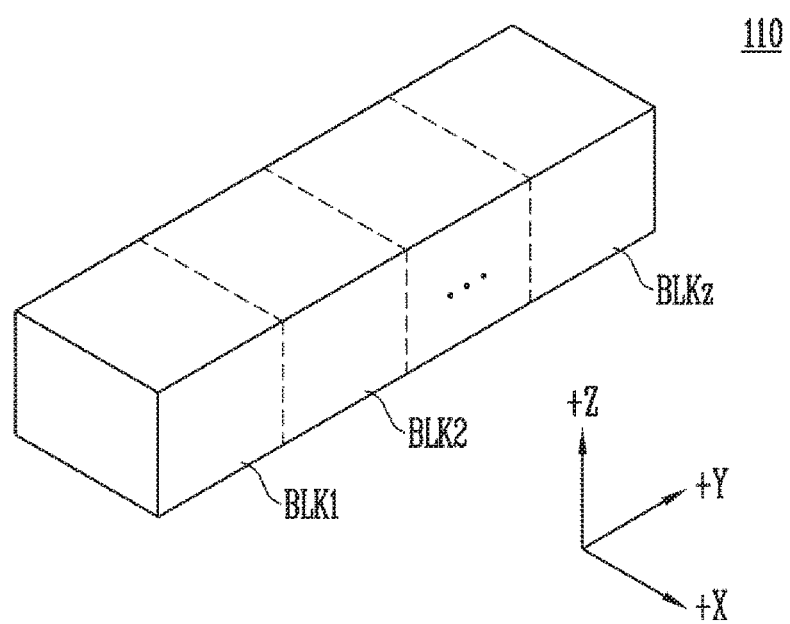
FIG. 2 is a diagram illustrating an embodiment of a memory cell array of FIG. 1.

FIG. 2 is a diagram illustrating an embodiment of a memory cell array of FIG. 1.

Referring to FIG. 2, the memory cell array 110 includes a plurality of memory blocks BLK1 to BLKz. Each memory block has a three-dimensional structure. Each memory block includes a plurality of memory cells stacked above a substrate. The plurality of memory cells are arranged along +X, +Y, and +Z directions. The structure of each memory block will be described in more detail with reference to FIGS. 3 and 4.

Figure 3:
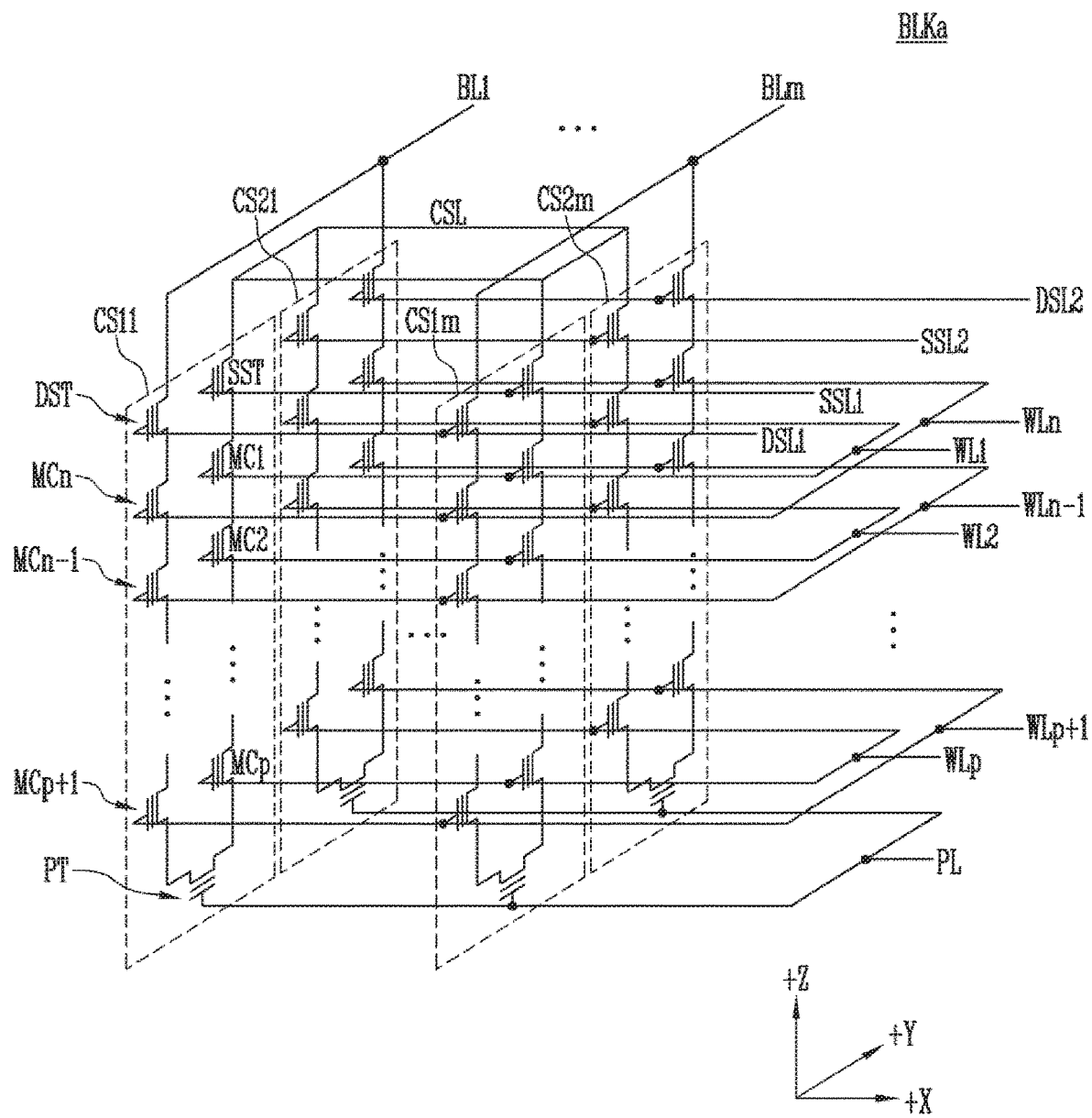
FIG. 3 is a circuit diagram illustrating any one memory block among memory blocks of FIG. 2.

FIG. 3 is a circuit diagram illustrating any one memory block BLKa among the memory blocks BLK1 to BLKz of FIG. 2.

Referring to FIG. 3, the memory block BLKa may include a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (i.e., a +X direction). Although FIG. 3 illustrates that two cell strings are arranged in a column direction (i.e., a +Y direction), the present disclosure is not limited thereto. That is, for convenience of description, it will be understood that three cell strings may be arranged in the column direction.

Each of the plurality of cell strings CS11 to CS1$m$ and CS21 to CS2$m$ may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 3, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 3, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When a large number of dummy memory cells are provided, the reliability of an operation of the memory block BLKa is improved. On the other hand, the size of the memory block BLKa is increased. When a small number of dummy memory cells are provided, the size of the memory block BLKa is decreased. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 4:
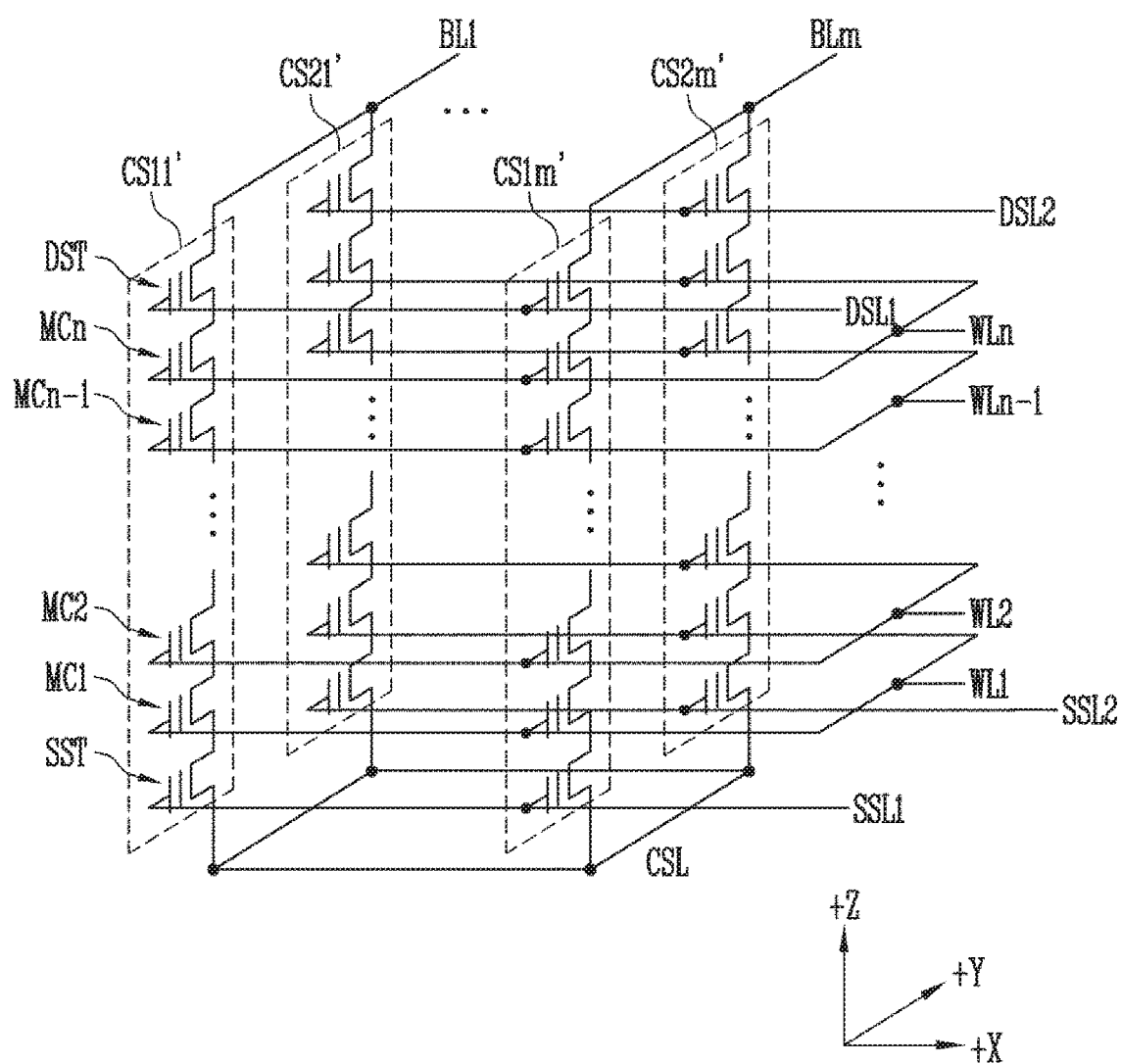
FIG. 4 is a circuit diagram illustrating another embodiment of the one memory block among the memory blocks of FIG. 2.

FIG. 4 is a circuit diagram illustrating another embodiment BLKb of the one memory block among the memory blocks BLK1 to BLKz of FIG. 2.

Referring to FIG. 4, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 4 has a circuit similar to that of the memory block BLKa of FIG. 3, except that the pipe transistor PT is excluded from each cell string in FIG. 4.

In another embodiment, even bit lines and odd bit lines may be provided instead of the first to mth bit lines BL1 to BLm. In addition, even-numbered cell strings among the cell strings CS11' to CS1$m$' or CS21' to CS2$m$' arranged in the row direction may be coupled to the even bit lines, respectively, and odd-numbered cell strings among the cell strings CS11' to CS1$m$' or CS21' to CS2$m$' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When a large number of dummy memory cells are provided, the reliability of an operation of the memory block BLKb is improved. On the other hand, the size of the memory block BLKb is increased. When a small number of dummy memory cells are provided, the size of the memory block BLKb is decreased. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 5:
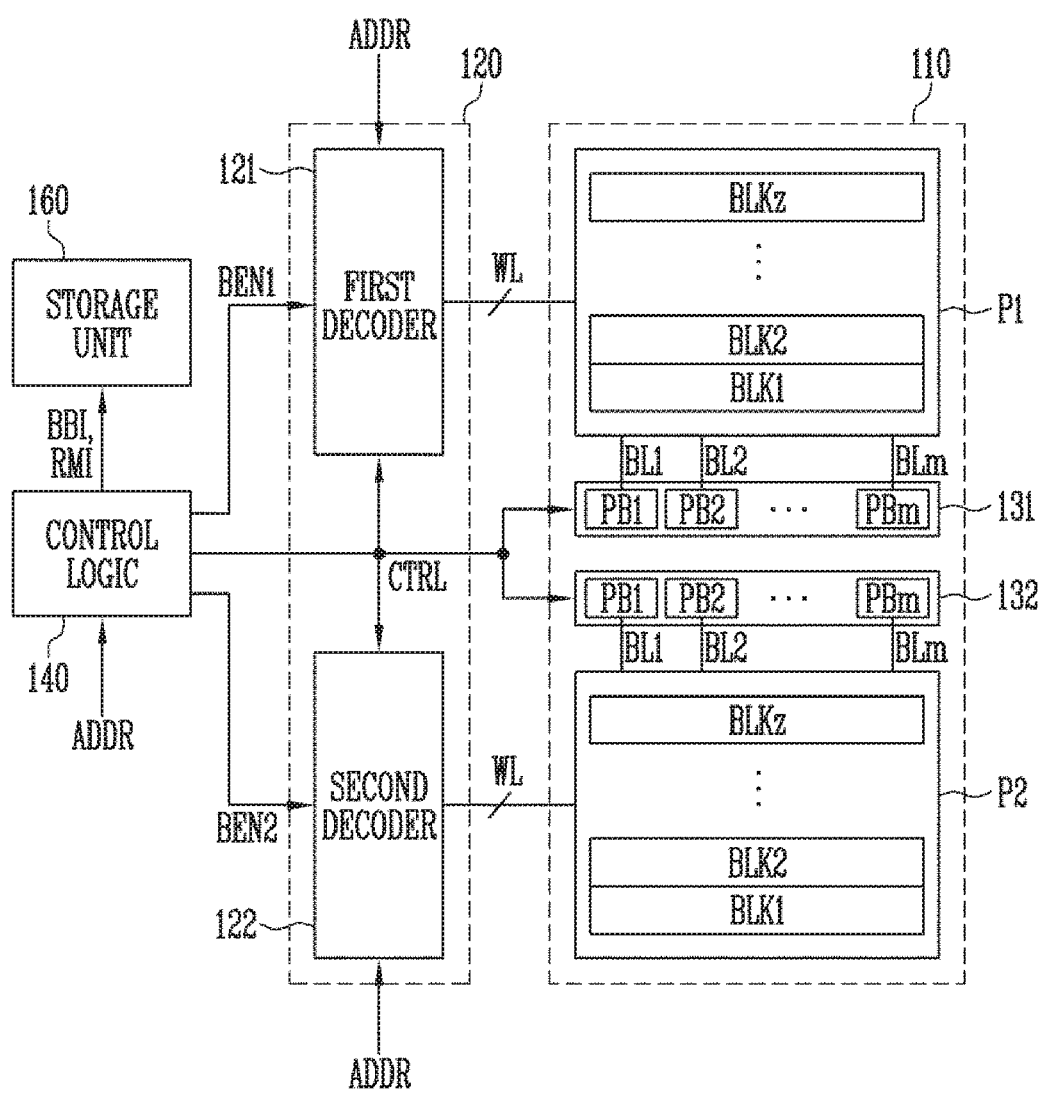
FIG. 5 is a block diagram illustrating in more detail some components of the semiconductor memory device shown in FIG. 1.

FIG. 5 is a block diagram illustrating in more detail some components of the semiconductor memory device shown in FIG. 1.

Referring to FIG. 5, the semiconductor memory device may include the memory cell array 110, the address decoder 120, read/write circuits 131 and 132, the control logic 140, and a storage unit 160. Although not shown in FIG. 5, it will be understood that the semiconductor memory device 100 in accordance with the embodiment of the present disclosure may further include the voltage generator 150 as shown in FIG. 1.

The memory cell array 110 is configured to include a plurality of planes. More specifically, the memory cell array 110 includes first and second planes P1 and P2 as shown in FIG. 5. Furthermore, the semiconductor memory device includes first and second read/write circuits 131 and 132 respectively corresponding to the first and second planes P1 and P2.

Each of the first and second planes P1 and P2 includes a plurality of memory blocks BLK1 to BLKz. The plurality of memory blocks BLK1 to BLKz are coupled to the address decoder 120 through word lines WL. The plurality of memory blocks BLK1 to BLKz are coupled to the first or second read/write circuit 131 or 132 through bit lines BL1 to BLm. Each of the plurality of memory blocks BLK1 to BLKz includes a plurality of memory cells. In an embodiment, the plurality of memory cells are nonvolatile memory cells, and memory cells coupled to the same word line among the plurality of memory cells are defined as one page. That is, each of the plurality of memory blocks BLK1 to BLKz is configured with a plurality of pages. Also, each of the plurality of memory blocks BLK1 to BLKz includes a plurality of cell strings. Each of the plurality of cell strings includes a drain select transistor, memory cells, and a source select transistor, which are coupled in series between a bit line and a source line.

The address decoder 120 includes a first decoder 121 and a second decoder 122.

The first decoder 121 may be activated in response to a first enable signal BEN2, and select at least one memory block among the plurality of memory blocks BLK1 to BLKz included in the first plane P1 in response to an address signal ADDR.

The second decoder 122 may be activated in response to a second enable signal BEN2, and select at least one memory block among the plurality of memory blocks BLK1 to BLKz included in the second plane P2 in response to an address signal ADDR.

The control logic 130 controls operations of the address decoder 120 and the first and second read/write circuits 131 and 132. The control logic 140 may update bad block marking data stored in the first and second decoders 121 and 122 by outputting the first and second enable signals BEN1 and BEN2. Also, the control logic 130 may generate bad block information BBI, based on the bad block marking data. Additionally, the control logic 130 may generate repair mapping information RMI, based on the bad block information BBI. The generated bad block information BBI and the generated repair mapping information RMI may be temporarily stored in the storage unit 160. Also, the generated bad block information BBI and the generated repair mapping information RMI may be stored in the memory cell array 110. In an embodiment, the storage unit 160 may be configured as a DRAM or SRAM that temporarily stores data. Although FIG. 5 illustrates that the storage unit 160 is configured separately from the control logic 140, it will be understood that, in some embodiments, the storage unit 160 may be integrally configured in the control logic 140.

In the semiconductor memory device 100 in accordance with the embodiment of the present disclosure, a result obtained by testing each memory block is stored in the decoder 121 or 122 of the address decoder 120. More specifically, bad block marking data that is a result obtained by testing each memory block, is stored in a bad block latch (not shown) in the decoder 121 or 122. The bad block latch will be described later with reference to FIG. 7. Meanwhile, the control logic 140 generates bad block information and repair mapping information, based on the bad block marking data stored in the bad block latch. The generated bad block information and the generated repair mapping information may be temporarily stored in the storage unit 160, and be finally programmed in a Content Addressable Memory (CAM) area of the memory cell array 110.

The memory cell array 110 may include a CAM area. The CAM area may include a plurality of memory cells included in at least one memory block. The memory block corresponding to the CAM area may be a CAM block. The CAM block and the memory block may have the same structure. Setting information of the semiconductor memory device 100 may be stored in the CAM area.

Specifically, conditions set related to a data input/output operation or other information may be stored in the CAM area. In an embodiment, a read/write performance number (P/E cycle), a bad column address, and bad block information may be stored in the CAM area. In addition, optional information required to perform an operation of the semiconductor memory device 100, e.g., program voltage information, read voltage information, erase voltage information, information on the thickness of a gate oxide layer of a cell, etc. may be stored in the CAM area. In an embodiment, repair mapping information may be stored in the CAM area. When power is supplied to the semiconductor memory device 100, information stored in the CAM area may be read by the read/write circuit 130 (131 and 132), and the semiconductor memory device 100 may be controlled to perform an input/output operation of memory cells under a condition set based on the read information. The setting information may be stored in the CAM area in a test phase of the semiconductor memory device 100. Conventionally, a test result of each memory block was transferred to a test apparatus at the outside of a semiconductor memory device, and thus bad block information and repair mapping information were generated by the test apparatus. Accordingly, when a plurality of semiconductor memory devices were tested before being packaged, a large-capacity memory was required in the test apparatus so as to store test results of memory blocks included in each of the semiconductor memory devices because a large number of semiconductor memory devices were tested. In addition, the test apparatus required high performance for processing a large number of calculations so as to generate bad block information and repair mapping information, corresponding to the plurality of semiconductor memory devices.

In the semiconductor memory device in accordance with the embodiment of the present disclosure and an operating method thereof, after a defect test is performed on each memory block, a result of the defect test is autonomously stored as bad block marking data in bad block latches L1 to Lz provided in the semiconductor memory device 100. Meanwhile, bad block information and repair mapping information are internally generated in the semiconductor memory device 100, based on the bad block marking data. Also, the bad block information and repair mapping information may be immediately stored in the CAM area after being generated. Thus, a bad block test on the memory blocks of the semiconductor memory device 100 and a CAM program for storing a result of the bad block test in the CAM area can be performed without any test apparatus having a large-capacity resource, which was conventionally required. Accordingly, the test cost and test time of the semiconductor memory device can be reduced.

Figure 6:
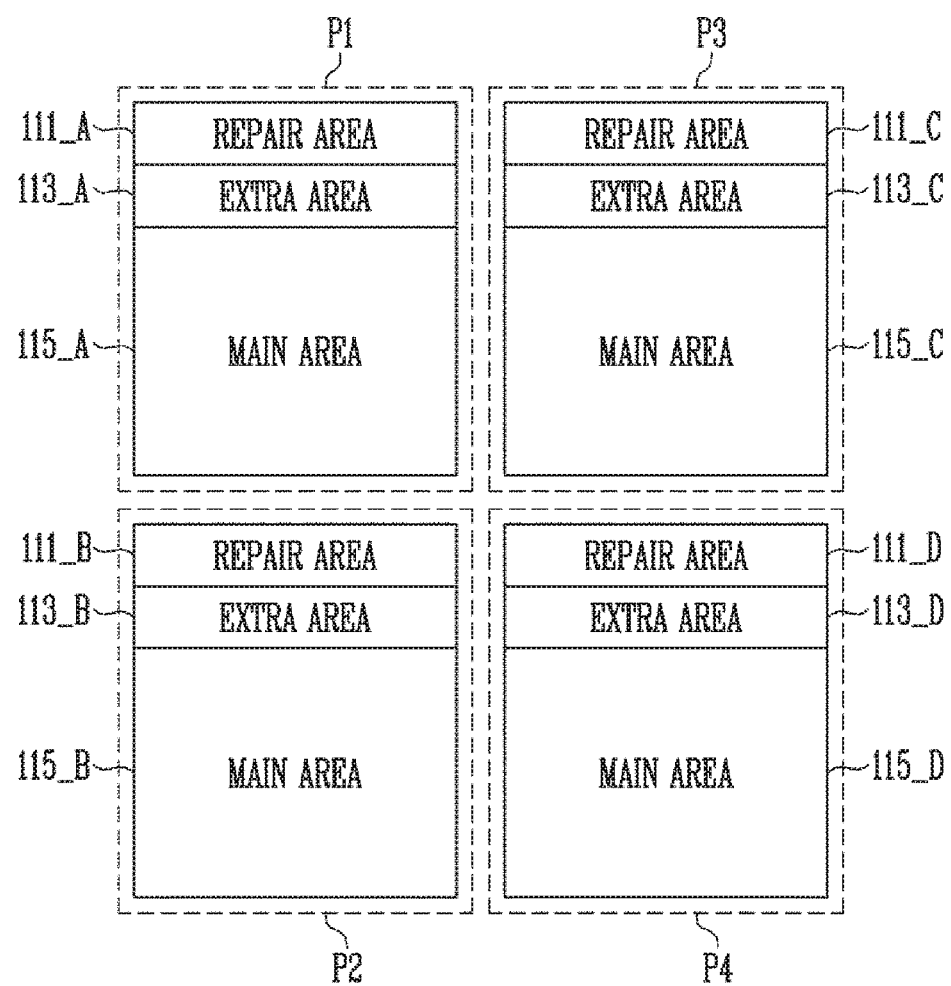
FIG. 6 is a diagram illustrating a structure of the memory cell array of the semiconductor memory device in accordance with an embodiment of the present disclosure.

FIG. 6 is a diagram illustrating a structure of the memory cell array 110 of the semiconductor memory device 100 in accordance with an embodiment of the present disclosure.

Referring to FIG. 6, the memory cell array 110 may include four planes P1, P2, P3, and P4. The planes P1, P2, P3, and P4 include repair areas 111_A, 111_B, 111_C, and 111_D, extra areas 113_A, 113_B, 113_C, and 113_D, and main areas 115_A, 115_B, 115_C, and 115_D, respectively. Each area may be configured to include at least one memory block.

A case where the memory cell array 110 includes the first plane P1 and the second plane P2 is illustrated in the embodiment shown in FIG. 5. However, in the semiconductor memory device 100 in accordance with the embodiment of the present disclosure, the number of planes included in the memory cell array 110 is not limited to two. For example, the memory cell array 110 may include four planes P1 to P4 as shown in FIG. 6. In another embodiment, the memory cell array 110 may include planes having a number which is larger than that shown in FIG. 6.

Hereinafter, for convenience of description, a case where the memory cell array 110 includes four planes P1 to P4 will be described as an example.

Figure 7:
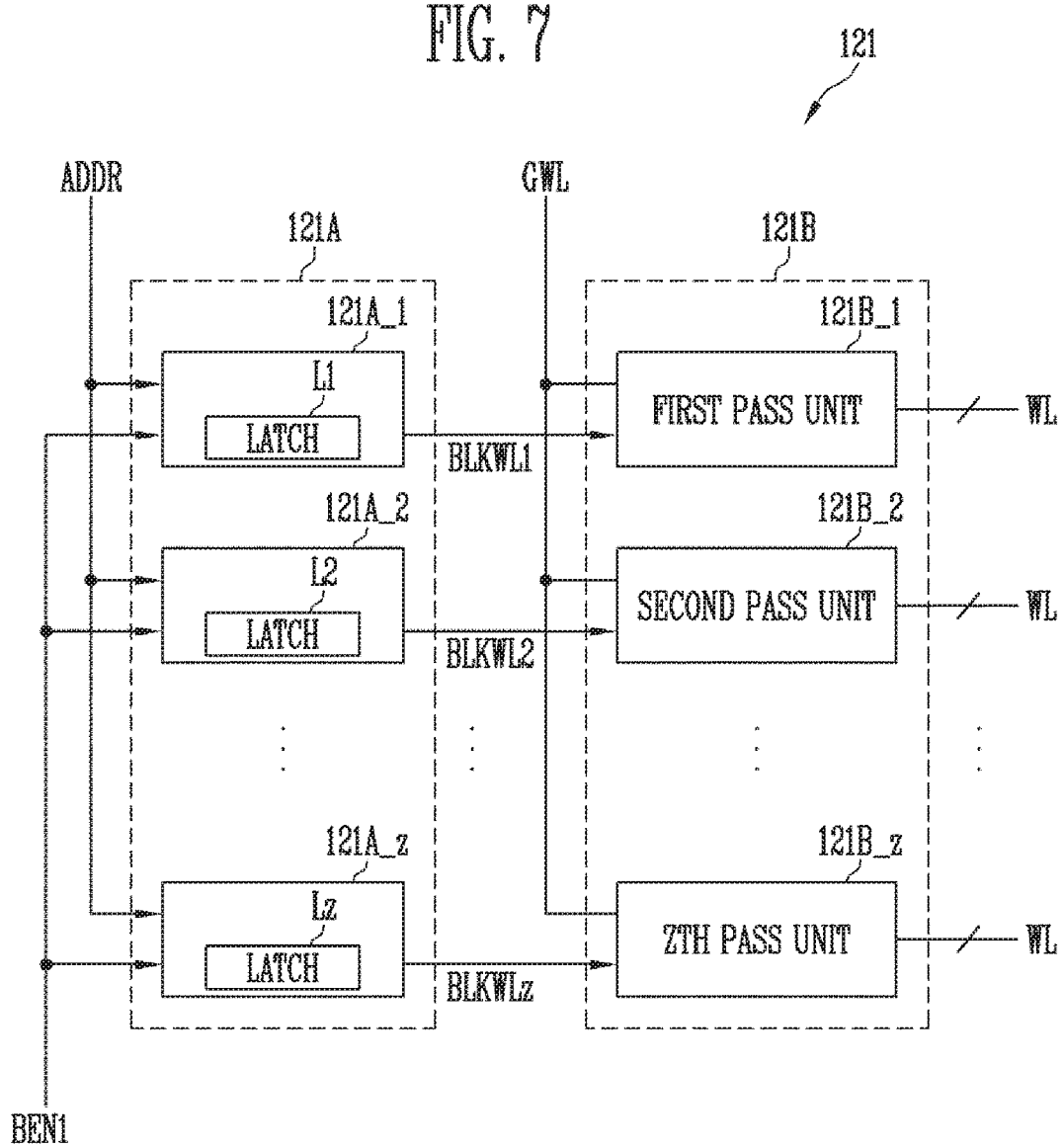
FIG. 7 is a block diagram illustrating a first decoder of FIG. 5.

FIG. 7 is a block diagram illustrating the first decoder of FIG. 5.

The first and second decoders 121 and 122 included in the address decoder 120 have similar configuration and coupling relationships, and therefore, the first decoder 121 will be described as an example.

Referring to FIG. 7, the first decoder 121 includes a block selection section 121A and a pass section 121B.

The block selection section 121A includes a plurality of block selection units 121A_1 to 121A_z respectively corresponding to the memory blocks BLK1 to BLKz. Each of the plurality of block selection units 121A_1 to 121A_z is activated in response to the first enable signal BEN1, and outputs one of block selection signals BLKWL1 to BLKWLz when an input address signal ADDR indicates an address of a corresponding block among the memory blocks BLK1 to BLKz. Also, the plurality of block selection units 121A_1 to 121A_z include bad block latches L1 to Lz for storing bad block information of the respective memory blocks BLK1 to BLKz.

The pass section 121B includes a plurality of pass units 121B_1 to 121B_z respectively corresponding to the memory blocks BLK1 to BLKz. The plurality of pass units 121B_1 to 121B_z are coupled to global word lines GWL. In response to the block selection signals BLKWL1 to BLKWLz output from the block selection section 121A, the plurality of pass units 121B_1 to 121B_z couples the global word lines GWL to word lines WL of selected memory blocks among the plurality of memory blocks BLK1 to BLKz. The global word lines GWL transfers operation voltages to the coupled word lines WL of the selected memory blocks.

Each of the bad block latches L1 to Lz may store bad block marking data indicating whether a corresponding memory block BLK1 to BLKz is a bad block. Meanwhile, each of the bad block latches L1 to Lz may output the stored bad block marking data in response to the address signal ADDR.

The control logic may generate bad block information and repair mapping information, based on the bad block marking data. The generation of bad block information and repair mapping information will be described later with reference to FIGS. 8 to 12.

Conventionally, a test result of each memory block was transferred to a test apparatus at the outside of a semiconductor memory device, and thus bad block information and repair mapping information were generated by the test apparatus. Accordingly, when a plurality of semiconductor memory devices were tested before being packaged, a large-capacity memory was required in the test apparatus to store test results of memory blocks included in each of the semiconductor memory devices because a large number of semiconductor memory devices were tested. In addition, the test apparatus required high performance for processing a large number of calculations to generate bad block information and repair mapping information, corresponding to the plurality of semiconductor memory devices.

In the semiconductor memory device in accordance with the embodiment of the present disclosure and an operating method thereof, after a defect test is performed on each memory block, a result of the defect test is autonomously stored as bad block marking data in bad block latches L1 to Lz provided in the semiconductor memory device 100. Meanwhile, bad block information and repair mapping information are internally generated in the semiconductor memory device 100, based on the bad block marking data. Also, the bad block information and repair mapping information may be immediately stored in the CAM area after being generated. Thus, a bad block test on the memory blocks of the semiconductor memory device 100 and a CAM program for storing a result of the bad block test in the CAM area can be performed without any test apparatus having a large-capacity resource, which was conventionally required. Accordingly, the test cost and test time of the semiconductor memory device can be reduced.

Figure 8:
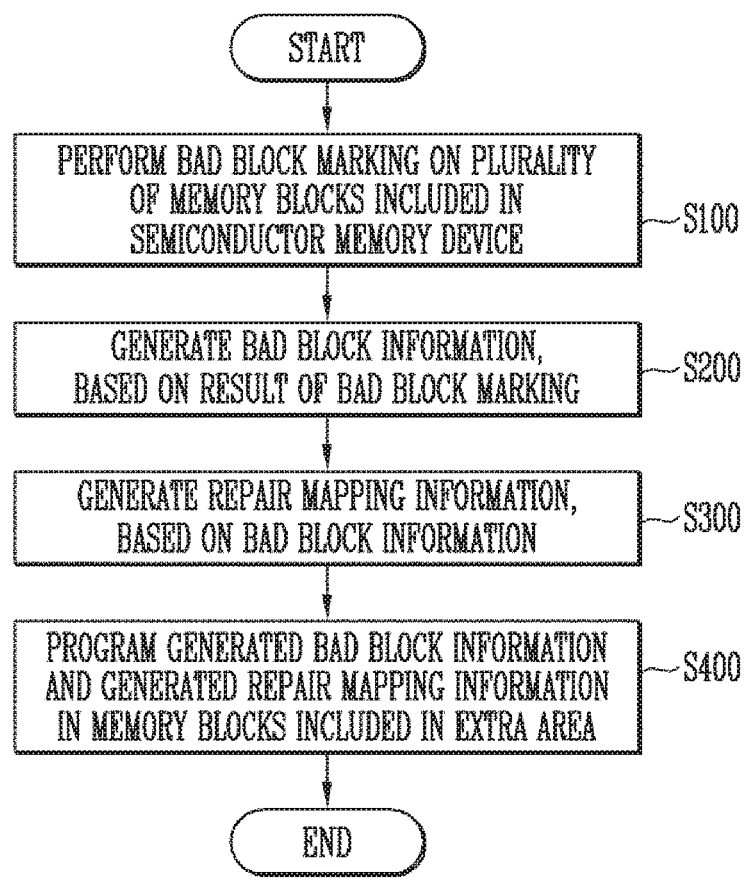
FIG. 8 is a flowchart illustrating an operating method of the semiconductor memory device in accordance with an embodiment of the present disclosure.

FIG. 8 is a flowchart illustrating an operating method of the semiconductor memory device in accordance with an embodiment of the present disclosure. Hereinafter, the operating method of the semiconductor memory device 100 in accordance with the embodiment of the present disclosure will be described with reference to FIGS. 5 to 8 together.

In step S100, bad block marking is performed on a plurality of memory blocks included in the semiconductor memory device 100. As an example, a test code is input by a test apparatus at the outside of the semiconductor memory device 100, to test whether a defect has occurred in each memory block. The control logic 140 may control the test process. In the test process, a plurality of tests may be performed on each of the memory blocks. In the step S100, a test result of each memory block may be generated as bad block marking data corresponding to the corresponding memory block. The bad block marking data of the memory blocks BLK1 to BLKz may be in the bad block latches L1 to Lz, respectively. For example, when the bad block marking data has a value of "1," this may indicate that the corresponding memory block is a bad block, and when the bad block marking data has a value of "0," this may indicate that the corresponding memory block is a normal block. The bad block marking data stored in the bad block latches L1 to Lz at the beginning of the test may be initialized to "0." When it is determined that a specific memory block is a bad block, the bad block marking may be performed by updating a value of the bad block marking data stored in a corresponding bad block latch from "0" to "1."

In the above example, it is assumed that when the data stored in the bad block latch represents "1," this may indicate that the corresponding memory block is a bad block, and when the data stored in the bad block latch represents "0," this may indicate that the corresponding memory block is a normal block. However, it will be understood that the opposite case is possible. For example, when the data stored in the bad block latch represents "1," this may indicate that the corresponding memory block is a normal block, and when the data stored in the bad block latch represents "0," this may indicate that the corresponding memory block is a bad block.

In step S200, bad block information BBI may be generated based on a result of the bad block marking. The bad block information BBI may be information obtained by collecting bad block marking data stored in the respective bad block latches L1 to Lz as the result of the bad block marking in the step S100. As an example, the bad block information BBI may include information shown in the following Table 1.

TABLE 1

| Area | Block number | First plane P1 | Second plane P2 | Third plane P3 | Fourth plane P4 |
|---|---|---|---|---|---|
| Repair area | 1 | Fail | | | Fail |
| | 2 | | Fail | | |
| | 3 | | | Fail | |
| | 4 | | | | |

TABLE 1-continued

| Area | Block number | First plane P1 | Second plane P2 | Third plane P3 | Fourth plane P4 |
|---|---|---|---|---|---|
| Extra area | 1 | Fail | Fail | Fail | |
| | 2 | CAM area (repair impossible) | | | |
| Main area | 1 | | | | |
| | 2 | | | | |
| | 3 | | | | Fail |
| | 4 | | | | |
| | 5 | | | | Fail |
| | 6 | | Fail | | |
| | 7 | | | Fail | Fail |
| | 8 | Fail | | Fail | |
| | 9 | | | Fail | Fail |
| | 10 | | | | |
| | 11 | Fail | | | |
| | 12 | | | | |
| | ... | | | | |

Referring to Table 1, the memory cell array 110 includes four planes P1 to P4 as shown in FIG. 6. Each of the planes P1 to P4 includes a repair area, an extra area, and a main area. A repair area included in one plane includes four memory blocks. An extra area included in one plane includes two memory blocks. A main area included in one plane includes a plurality of memory blocks.

It can be seen that a first memory block indicated by "1" among memory blocks included in a repair area of a first plane P1 has failed. Therefore, the first memory block of the repair area of the first plane P1 is a bad block. Second to fourth memory blocks of the repair area of the first plane P1 are normal blocks.

Meanwhile, a first memory block of an extra area of the first plane P1 is also a bad block. In addition, a second memory block of the extra area of the first plane P1 is a CAM area and is a normal block. As shown in Table 1, it can be seen that the CAM area is an area that cannot be repaired.

First to seventh, ninth, tenth, and twelfth memory blocks of a main area of the first plane P1 are normal blocks. Meanwhile, eighth and eleventh memory blocks of the main area of the first plane P1 are bad blocks.

Similarly, it can be seen that a second memory block indicated by "2" among memory blocks included in a repair area of a second plane P2 has failed. Therefore, the second memory block of the repair area of the second plane P2 is a bad block. First, third, and fourth memory blocks of the repair area of the second plane P2 are normal blocks.

Meanwhile, a first memory block of an extra area of the second plane P2 is also a bad block. In addition, a second memory block of the extra area of the second plane P2 is a CMA area and is a normal block.

All memory blocks of a main area of the second plane P2 are normal blocks.

Meanwhile, a third memory block among memory blocks included in a repair area of a third plane P3 is a bad block. First, second, and fourth memory blocks of the repair area of the third plane P3 are normal blocks.

Meanwhile, a first memory block of an extra area of the third plane P3 is also a bad block. In addition, a second memory block of the extra area of the third plane P3 is a CAM area and is a normal block.

Sixth to ninth memory blocks of a main area of the third plane P3 are bad blocks. The other memory blocks of the main area of the third plane P3 are normal blocks.

Meanwhile, a first memory block among memory blocks included in a repair area of a fourth plane P4 is a bad block. Second, third, and fourth memory blocks of the repair area of the fourth plane P4 are normal blocks.

Meanwhile, a first memory block of an extra area of the fourth plane P4 is a normal block. In addition, a second memory block of the extra area of the fourth plane P4 is a CAM area and is a normal block.

Third, fifth, seventh, and ninth memory blocks of a main area of the fourth plane P4 are bad blocks. The other memory blocks of the main area of the fourth plane P4 are normal blocks.

As shown in Table 1, bad block information BBI may be generated by reading the bad block marking data stored in the bad block latches L1 to Lz respectively corresponding to the memory blocks BLK1 to BLKz and collecting the read bad block marking data. In this process, the control logic 140 may generate bad block information BBI by sequentially reading the bad block marking data stored in the bad block latches L1 to Lz included in each of the decoders 121 and 122 of the address decoder 120. As shown in FIG. 5, the generated bad block information BBI may be temporarily stored in the storage unit 160.

In step S300, repair mapping information RMI is generated based on the generated bad block information BBI. The repair mapping information RMI may be data indicating which bad block is mapped to a memory block included in the repair area. For example, the repair mapping information RMI may be configured as shown in the following Table 2.

TABLE 2

| Plane number | Block number | Repair block address |
|---|---|---|
| P1 | 1 | Fail |
|  | 2 | First memory block of extra area |
|  | 3 | Eighth memory block of main area |
|  | 4 | Eleventh memory block of main area |
| P2 | 1 | First memory block of extra area |
|  | 2 | Fail |
|  | 3 | Unused |
|  | 4 | Unused |
| P3 | 1 | First memory block of extra area |
|  | 2 | Sixth memory block of main area |
|  | 3 | Fail |
|  | 4 | Seventh memory block of main area |
| P4 | 1 | Fail |
|  | 2 | Third memory block of main area |
|  | 3 | Fifth memory block of main area |
|  | 4 | Seventh memory block of main area |

As described above with reference to Table 1, the repair area of each of the planes P1 to P4 includes four memory blocks. Hereinafter, a method for forming the repair mapping information will be described with reference to Table 1 and Table 2 together.

First, the first plane P1 will be described. Referring to Table 1, the first memory block of the repair area of the first plane P1 is a bad bock, and the first memory block of the extra area of the first plane P1 is a bad block. Therefore, the second memory block that is not a bad block and has the highest order of priority among the memory blocks included in the repair area of the first plane P1 is mapped to the first memory block of the extra area. In addition, the eighth and eleventh memory blocks of the main area of the first plane P1 are sequentially mapped to the third and fourth memory blocks of the repair area. These details are described with respect to the first plane P1 of Table 2.

The second plane P2 will be described. Referring to Table 1, the second memory block of the repair area of the second plane P2 is a bad block, and the first memory block of the extra area of the second plane P2 is a bad block. Therefore, the first memory block that is not a bad block and has the highest order of priority among the memory blocks included in the repair area of the second plane P2 is mapped to the first memory block of the extra area. In addition, since the main area of the second plane P2 does not include any bad block, repair mapping is not performed any more. Accordingly, the third and fourth memory blocks of the repair area of the second plane are left in an unused state. These details are described with respect to the second plane P2 of Table 2.

The third plane P3 will be described. Referring to Table 1, the third memory block of the repair area of the third plane P3 is a bad block, and the first memory block of the extra area of the third plane P3 is a bad block. Therefore, the first memory block that is not a bad block and has the highest order of priority among the memory blocks included in the repair area of the third plane P3 is mapped to the first memory block of the extra area. In addition, the sixth to ninth memory blocks of the main area of the third plane P3 are bad blocks. Since the number of memory blocks left in the repair area is 2 (the second and fourth memory blocks of the repair area), the sixth and seventh memory blocks of the main area are sequentially mapped to the second and fourth memory blocks of the repair area. Meanwhile, since any memory block is not currently left in the repair area, the eighth and ninth memory blocks of the main area are not mapped to the repair area.

The fourth plane P4 will be described. Referring to Table 1, the first memory block of the repair area of the fourth plane P4 is a bad block, and the extra area of the fourth plane P4 does not include any bad block. Meanwhile, the third, fifth, seventh, and ninth memory blocks of the main area of the fourth plane P4 are bad blocks. Since the number of memory blocks left in the repair area is 3 (the second to fourth memory blocks of the repair area), the third, fifth, and seventh memory blocks of the main area are sequentially mapped to the second to fourth memory blocks of the repair area. Meanwhile, since any memory block is not currently left in the repair area, the ninth memory block of the main area is not mapped to the repair area.

Referring to Table 2, when the repair mapping information is generated, repair mapping information on the extra area of each of the planes P1 to P4 is first generated, and repair mapping information is then generated. This is because the space security of the extra area may be more important than that of the main area, and hence an order of priority is provided to the extra area. Accordingly, when bad blocks exist in the extra area and the main area, the extra area is first repaired, and the main area is then repaired.

In this manner, repair mapping information RIM may be generated as shown in Table 2. As shown in FIG. 5, the generated repair mapping information RIM may be temporarily stored in the storage unit 160.

In step S400, the bad block information BBI and the repair mapping information RMI may be programmed in a memory block included in the extra area. As described in Table 1, the second memory blocks in the extra area constitute a CMA area, and the bad block information BBI and the repair mapping information RMI may be programmed in the CMA area. To this end, the bad block information BBI and the repair mapping information RMI may be transferred to the read/write circuit 130, 131 and 132, to be programmed in corresponding memory blocks.

As described above, in the semiconductor memory device in accordance with the embodiment of the present disclosure and the operating method thereof, a defect test of each memory block and bad block information and repair mapping information corresponding thereto are internally generated in the semiconductor memory device 100. In addition, the generated bad block information and the generated repair mapping information may be immediately stored in the CAM area after being generated. Thus, a bad block test on the memory blocks of the semiconductor memory device 100 and a CAM program for storing a result of the bad block test in the CAM area can be performed without any test apparatus having a large-capacity resource, which was conventionally required.

Figure 9:
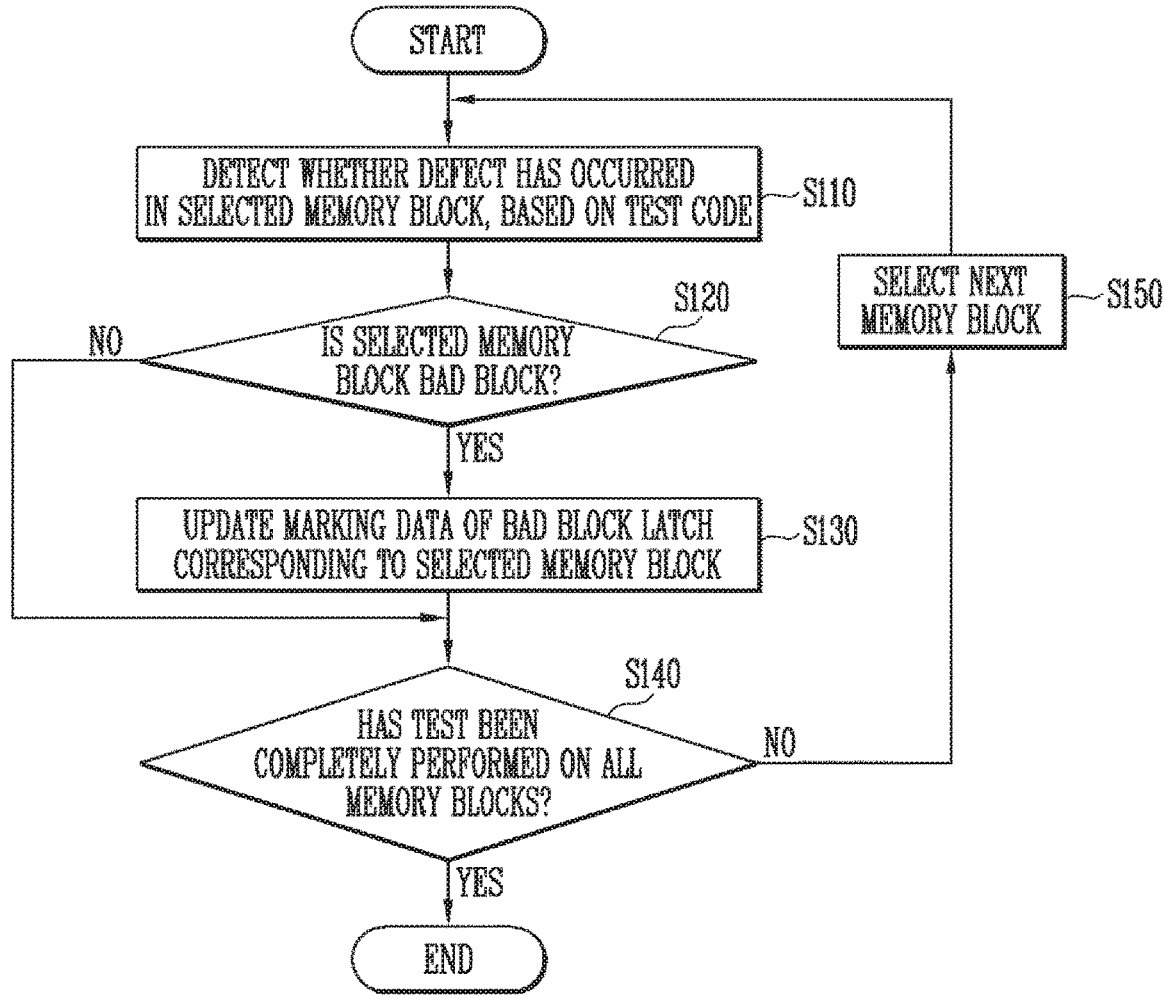
FIG. 9 is a flowchart illustrating an exemplary embodiment of a step of performing bad block marking, which is shown in FIG. 8.

FIG. 9 is a flowchart illustrating an exemplary embodiment of the step S100 of performing the bad block marking, which is shown in FIG. 8.

Referring to FIG. 9, first, whether a defect has occurred in a selected memory block is detected, based on a test code at step S110. In the step S110, whether a defect has occurred in a selected memory block may be detected in various manners. For example, whether a defect has occurred in a selected memory block may be detected in a manner that determines whether, after the test code is programmed in the corresponding memory block, the programming has been normally completed through a read operation. In another example, whether a defect has occurred in a selected memory block may be detected based on whether, after an erase operation is performed, the erase operation has failed. It will be understood that whether a defect has occurred in the corresponding memory block may be detected in other various manners.

In step S120, whether the selected memory block is a bad block is determined when whether a defect has occurred in the corresponding memory block is detected. When the selected memory block is a bad block, the bad block marking data of a bad block latch corresponding to the selected memory block is updated at step S130. As described above with reference to FIG. 7, the bad block marking data indicating whether the memory blocks BLK1 to BLKz corresponding to the bad block latches L1 to Lz are bad blocks may be stored. As an example, the bad block latches L1 to Lz may be initialized to store "0" at the beginning of a test. Then, when the selected memory block is determined as a bad block, the data stored in the corresponding bad block latch in the step S130 may be updated to "1." Then, the method proceeds to step S140. As shown in the drawing, when the selected memory block is a normal block as the determination result of the step S120, the method proceeds to the step S140 without performing the step S130.

In the step S140, whether the test has been completely performed on all memory blocks. When the test is completely performed on all memory blocks, the bad block marking may be ended. When the test is not completely performed on all memory blocks, a next memory block adjacent to the selected memory block may be selected at step S150, and the steps S110 to S140 may be repeatedly performed on the next memory block.

Figure 10:
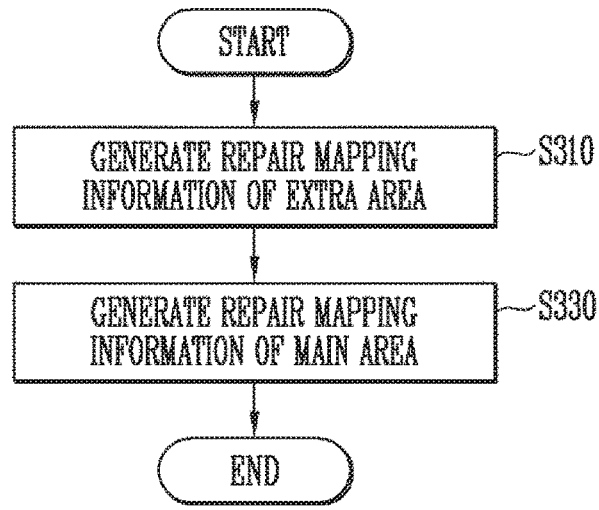
FIG. 10 is a flowchart illustrating in detail a step of generating repair mapping information, which is shown in FIG. 8.

FIG. 10 is a flowchart illustrating in detail the step S300 of generating the repair mapping information, which is shown in FIG. 8.

Referring to FIG. 10, first, repair mapping information RMI of the extra area is generated at step S310, and repair mapping information RMI of the main area is then generated at step S330. As described above with reference to Table 2, when the repair mapping information RMI is generated, repair mapping information RMI on the extra area of each of the planes P1 to P4 may be generated, and repair mapping information RMI on the main area may be then generated.

Figure 11:
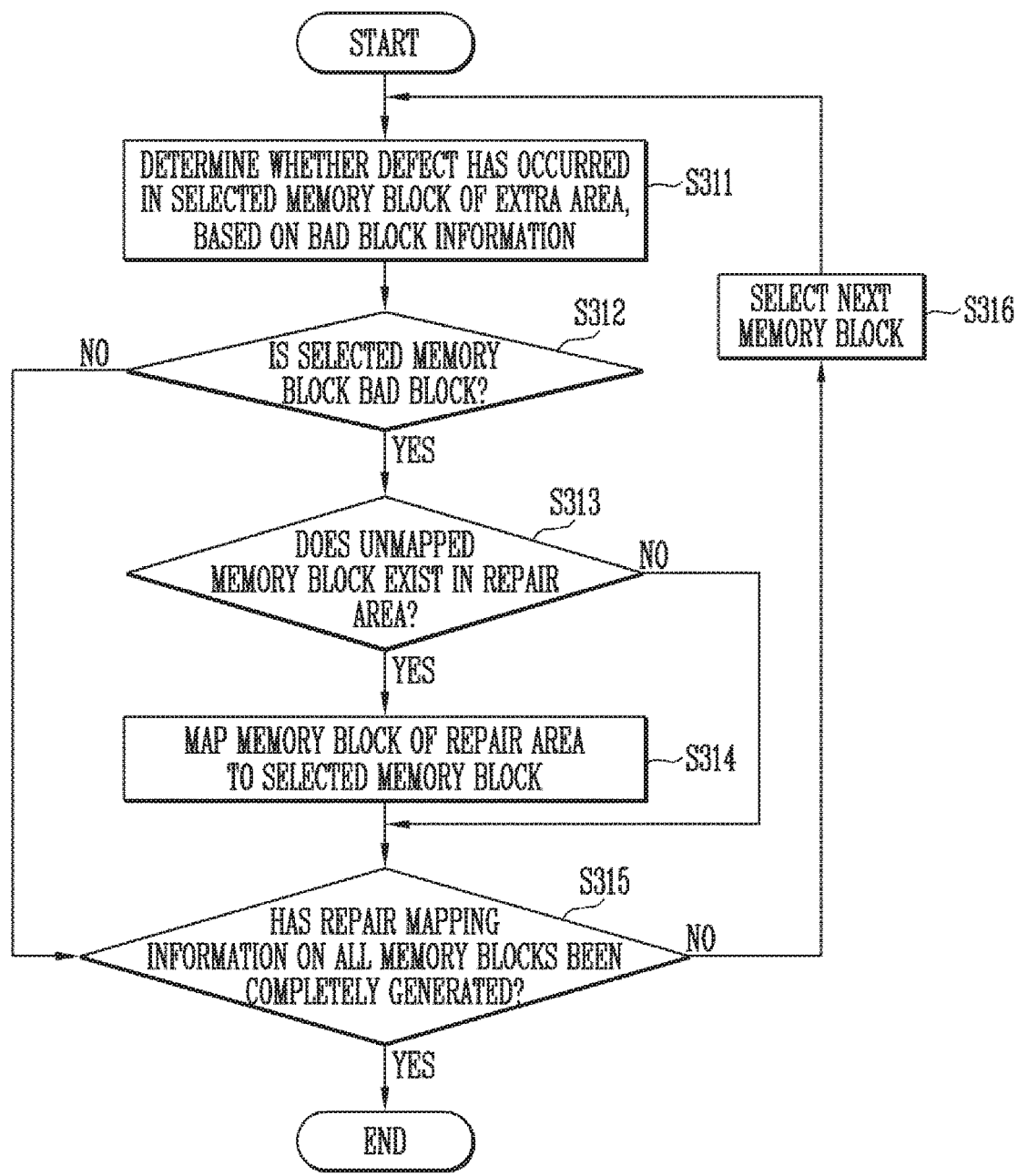
FIG. 11 is a flowchart illustrating in more detail a step of generating repair mapping information of an extra area, which is shown in FIG. 10.

FIG. 11 is a flowchart illustrating in more detail the step S310 of generating the repair mapping information RMI of the extra area, which is shown in FIG. 10.

First, whether a defect has occurred in a selected memory block of the extra area is determined based on the bad block information BBI at step S311. The bad block information BBI shown in Table 2, which is generated in the step S200, may be referred. As a result obtained by determining whether the selected memory block is a bad block at step S312, when the selected memory block is a bad block, whether an unmapped memory block exists in the repair area is determined at step S313. When an unmapped memory block exists in the repair area, the unmapped memory block of the repair area is mapped to the currently selected memory block at step S314. Then, the method proceeds to step S315. When any extra memory block does not exist in the repair area, the step S314 cannot be performed, and hence the method proceeds to the step S315.

Meanwhile, when the selected memory block is a normal block as the determination result of the step S312, repair mapping is not required, and hence the method immediately proceeds to the step S315.

In the step S315, whether repair mapping information on all memory blocks has been completely generated is determined. When repair mapping information on all memory blocks is completely generated, the generation of the repair mapping information is ended. When repair mapping information on all memory blocks is not completely generated, a next memory block is selected at step S316, and the steps S311 to S315 are repeated.

The process of generating the repair mapping information of the extra area is illustrated with reference to FIG. 11. However, the step S330 of generating the repair mapping information of the main area may be similarly performed, and therefore, its detailed description will be omitted.

Figure 12:
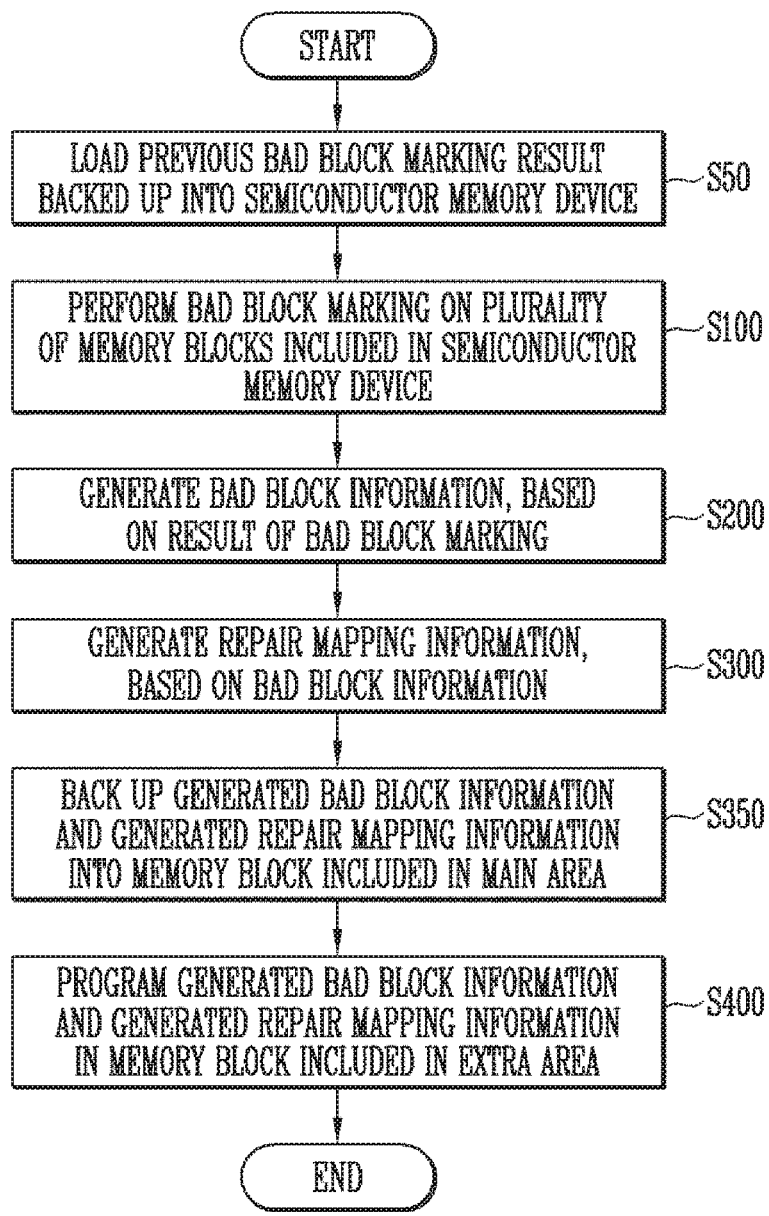
FIG. 12 is a flowchart illustrating an operating method of the semiconductor memory device in accordance with an embodiment of the present disclosure.

FIG. 12 is a flowchart illustrating an operating method of the semiconductor memory device in accordance with another embodiment of the present disclosure.

Referring to FIG. 12, the operating method of the semiconductor memory device includes a step S50 of loading a previous bad block marking data backed up into the semiconductor memory device, a step S100 of performing bad block marking on a plurality of memory blocks included in the semiconductor memory device, a step S200 of generating bad block information BBI, based on a bad block marking result, a step S300 of generating repair mapping information RMI, based on the bad block information BBI, a step S350 of backing up the generated bad block information and the generated repair mapping information into a memory block included in the main area, and a step S400 of programming the generated bad block information and the generated repair mapping information in a memory block included in the extra area. The steps S100, S200, S300, and S400 among the steps shown in FIG. 12 are substantially identical to the steps S100, S200, S300, and S400 shown in FIG. 8, and therefore overlapping descriptions will be omitted.

First, referring to FIG. 8, after bad block information BBI is generated at step S200 and repair mapping information RMI is generated at step S300, there may occur a situation in which the semiconductor memory device 1000 is suddenly power off while the bad block information BBI and the repair mapping information RMI are being programmed in a CAM area or before the bad block information BBI and the repair mapping information RMI are programmed. In accordance with the embodiment of FIG. 8, the operating method is to be re-started from the step at step S100 of performing bad block marking on all memory blocks.

In accordance with the embodiment shown in FIG. 12, after bad block information BBI is generated at step S200 and repair mapping information RMI is generated at step S300, the generated bad block information BBI and the generated repair mapping information RMI are backed up into a memory block included in the main area at step S350. After the backup, when the semiconductor memory device 100 is powered off before the step S400 is performed or while the step S400 is being performed, previous bad block marking data is loaded in the step S50. More specifically, in the step S50, bad block marking data may be extracted from the bad block information BBI backed up into the main area before the power-off and then stored in the bad block latches L1 to Lz. From the step S100, the bad block marking is not performed on the memory block into which the bad block marking data is loaded, but performed on only the other memory blocks. Thus, a bad block marking process can be resumed at a point of time of the backup, and accordingly, repeated bad block marking can be reduced.

In the step S350, the bad block information BBI and the repair mapping information RMI are programmed in the main area, using a normal program method. On the other hand, in the step S400, the bad block information BBI and the repair mapping information RMI are programmed in a memory block included in the CAM area of the extra area, using a CAM program method. The CAM program method may be a program method that is more reliable than the normal program method. For example, the CAM program method may be an operation method in which the same data is repeatedly programmed a predetermined number of times, so that a read operation can be stably performed even when memory cells are degraded later. For example, while one bit included in data is programmed in one memory cell in the normal program method, one bit of data may be repeatedly programmed in two or more memory cells in the CAM program method. Thus, while the normal program method of the step S350 has a short program time, the CAM program method of the step S400 may have a long program time. Accordingly, it is highly likely that the semiconductor memory device will be powered off in the step S400. In order to provide against this situation, the bad block information and the repair mapping information are backed up into the main area for a short time in the step S350.

Figure 13:
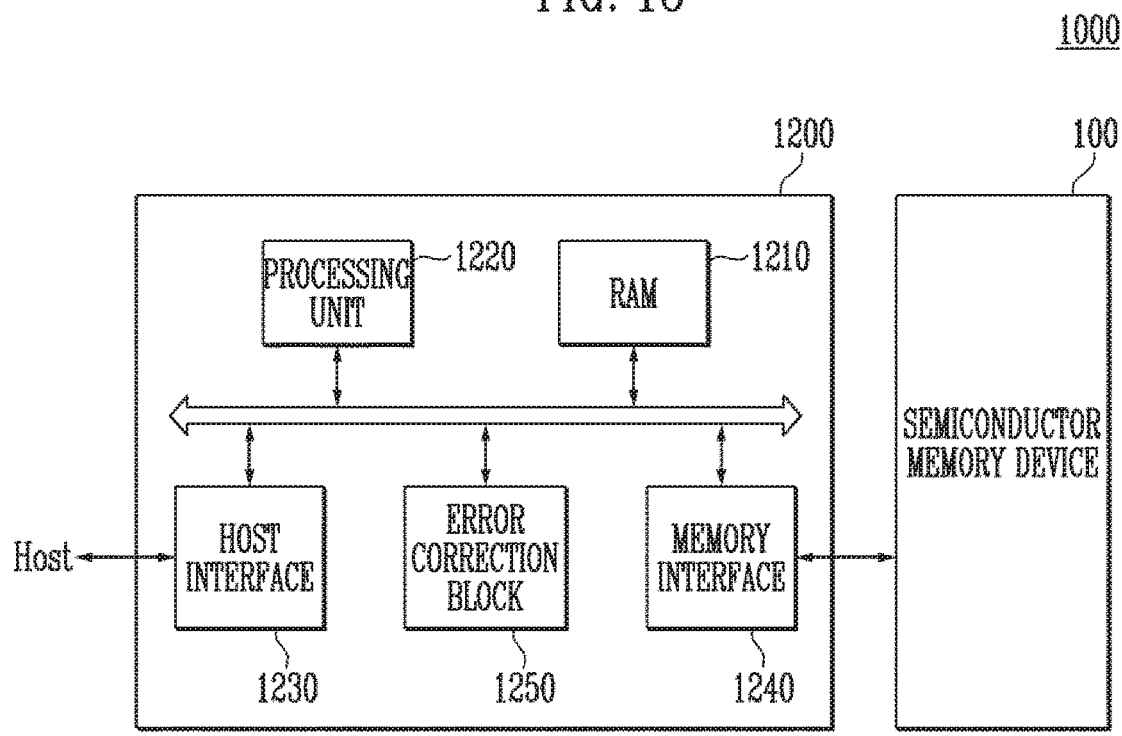
FIG. 13 is a block diagram illustrating a memory system including the semiconductor memory device shown in FIG. 1.

FIG. 13 is a block diagram illustrating a memory system 1000 including the semiconductor memory device 100 of FIG. 1.

Referring to FIG. 13, the memory system 1000 includes a semiconductor memory device 100 and the controller 1100.

The semiconductor memory device 100 may be configured and operated as described with reference to FIGS. 1 to 12. Hereinafter, overlapping descriptions will be omitted.

The controller 1200 is coupled to a host Host and the semiconductor memory device 100. The controller 1200 is configured to access the semiconductor memory device 100 in response to a request from the host Host. For example, the controller 1200 is configured to control read, write, erase, and background operations of the semiconductor memory device 100. The controller 1200 is configured to provide an interface between the semiconductor memory device 100 and the host Host. The controller 1200 is configured to drive firmware for controlling the semiconductor memory device 100.

The controller 1200 includes a random access memory (RAM) 1210, a processing unit 1220, a host interface 1230, a memory interface 1240, and an error correction block 1250. The RAM 1210 is used as at least one of a working memory of the processing unit 1220, a cache memory between the semiconductor memory device 100 and the host Host, and a buffer memory between the semiconductor memory device 100 and the host Host. The processing unit 1220 controls overall operations of the controller 1200.

The host interface 1230 includes a protocol for exchanging data between the host Host and the controller 1200. In an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 interfaces with the semiconductor memory device 100. For example, the memory interface 1240 may include a NAND interface or a NOR interface.

The error correction block 1250 is configured to detect and correct an error of data received from the semiconductor memory device 100 by using an error correction code (ECC).

The controller 1200 and the semiconductor memory device 100 may be integrated into one semiconductor device. In an exemplary embodiment, the controller 1200 and the semiconductor memory device 100 may be integrated into one semiconductor device, to constitute a memory card. For example, the controller 1200 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1200 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), or wafer-level processed stack package (WSP).

Figure 14:
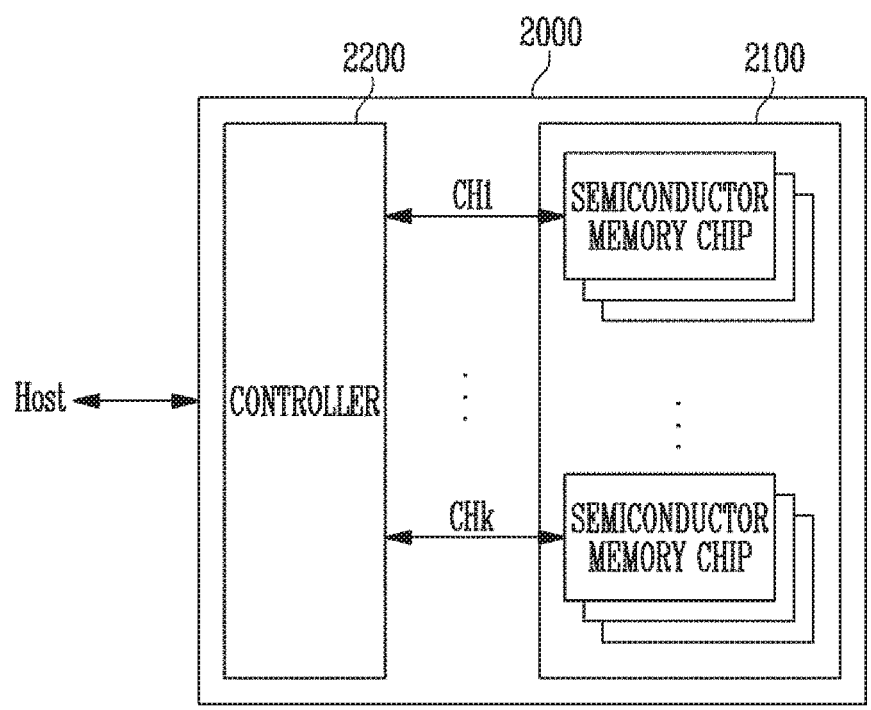
FIG. 14 is a block diagram illustrating an application example of the memory system shown in FIG. 13.

FIG. 14 is a block diagram illustrating an application example 2000 of the memory system 1000 of FIG. 13.

Referring to FIG. 14, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 14, it is illustrated that the plurality of groups communicate with the controller 2200 through first to kth channels CH1 to CHk. Each semiconductor memory chip may be configured and operated identically to the semiconductor memory device 100 described with reference to FIG. 1.

Each group is configured to communicate with the controller 2200 through one common channel. The controller 2200 is configured similarly to the controller 1200 described with reference to FIG. 13. The controller 2200 is configured to control the plurality of memory chips of the semiconductor memory device 2100 through the plurality of channels CH1 to CHk.

In FIG. 14, it has been illustrated that a plurality of semiconductor memory chips are coupled to one channel. However, it will be understood that the memory system 2000 may be modified such that one semiconductor memory chip is coupled to one channel.

Figure 15:
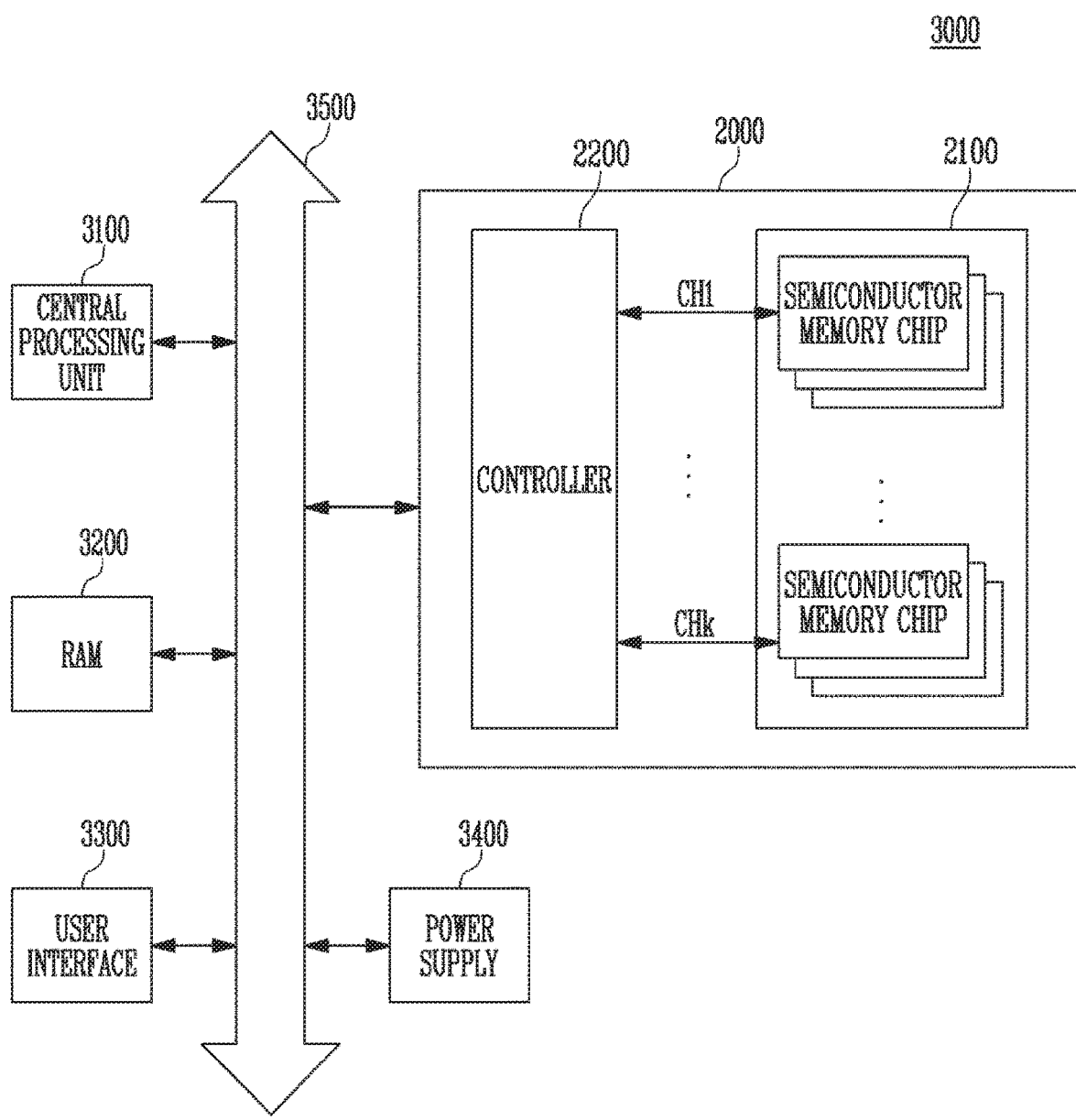
FIG. 15 is a block diagram illustrating a computing system including the memory system described with reference to FIG. 14.

FIG. 15 is a block diagram illustrating a computing system 3000 including the memory system 2000 described with reference to FIG. 14.

Referring to FIG. 15, the computing system 3000 includes a central processing unit 3100, a RAM 3200, a user interface 3300, a power supply 3400, a system bus 3500, and the memory system 2000.

The memory system 2000 is electrically coupled to the central processing unit 3100, the RAM 3200, the user interface 3300, and the power supply 3400 through the system bus 3500. Data supplied through user interface 3300 or data processed by the central processing unit 3100 are stored in the memory system 2000.

In FIG. 15, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 15, it is illustrated that the memory system 2000 described with reference to FIG. 14 is provided. However, the memory system 2000 may be replaced by the memory system 1000 described with reference to FIG. 13. In an embodiment, the computing system 3000 may be configured to include both the memory systems 1000 and 2000 described with reference to FIGS. 13 and 14.

In accordance with the present disclosure, there can be provided a semiconductor memory device capable of reducing test cost and test time.

Further, in accordance with the present disclosure, there can be provided an operating method of a semiconductor memory device capable of reducing test cost and test time.

Example embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
 a memory cell array including a plurality of memory blocks;
 a read/write circuit configured to perform a read/write operation on a selected page of the memory cell array;
 an address decoder configured to store bad block marking data on each of the plurality of memory blocks, and output the bad block marking data in response to an address signal; and
 a control logic configured to control the read/write circuit to test whether a defect has occurred in the plurality of memory blocks, and control the address decoder to store, as the bad block marking data, a test result representing whether the defect has occurred in the plurality of memory blocks,
 wherein the address decoder comprises a plurality of bad block latches,
 each of the plurality of bad block latches corresponds to a respective one of the plurality of memory blocks,
 a bad block latch of the plurality of bad block latches stores bit data indicating whether a memory block corresponding to the bad block latch is a normal block or a bad block, and
 the address decoder outputs bit data of the plurality of bad block latches as the bad block marking data.

2. The semiconductor memory device of claim 1, wherein the memory cell array includes a repair area and a main area, which each includes at least one memory block.

3. The semiconductor memory device of claim 2, wherein the control logic:
 generates bad block information by collecting the bad block marking data; and
 generates repair mapping information, based on the bad block information.

4. The semiconductor memory device of claim 3, wherein the memory cell array includes an extra area including at least one memory block,
 wherein the control logic controls the read/write circuit to program at least one of the bad block information and the repair mapping information in a memory block of the extra area.

5. The semiconductor memory device of claim 4, wherein the control logic controls the read/write circuit to back up at least one of the bad block information and the repair mapping information into a memory block of the main area.

6. A method for operating a semiconductor memory device including a plurality of memory blocks and a plurality of bad block latches, each of the plurality of bad block latches corresponding to a respective one of the plurality of memory blocks, the method comprising:
   performing bad block marking on each of the plurality of memory blocks;
   generating bad block information, based on a result of the bad block marking;
   generating repair mapping information, based on the bad block information; and
   programming at least one of the bad block information and the repair mapping information in at least one of the plurality of memory blocks,
   wherein the performing of the bad block marking includes:
   detecting whether a defect has occurred in a selected memory block among the plurality of memory blocks; and
   updating data of a bad block latch, among the plurality of bad block latches, corresponding to the selected memory block, based on a result obtained by detecting whether the defect has occurred in the selected memory block, and
   wherein the data of the bad block latch indicates whether a corresponding memory block is a normal block or a bad block.

7. The method of claim 6, wherein the bad block latch is included in an address decoder of the semiconductor memory device.

8. The method of claim 6, wherein, in the generating of the bad block information, the bad block information is generated by collecting data stored in the bad block latch.

9. The method of claim 6, wherein the plurality of memory blocks are distinguished to belong to any one of a repair area, an extra area, and a main area,
   wherein, in the generating of the repair mapping information, the repair mapping information is generated by mapping at least one memory block having a defect among memory blocks belonging to the extra area and the main area to a memory block belonging to the repair area.

10. The method of claim 9, wherein the generating of the repair mapping information includes:
   generating repair mapping information on memory blocks belonging to the extra area; and
   generating repair mapping information on memory blocks belonging to the main area.

11. A method for operating a semiconductor memory device including a plurality of memory blocks and a plurality of bad block latches, each of the plurality of bad block latches corresponding to a respective one of the plurality of memory blocks, the method comprising:
   loading a previous bad block marking result backed up into at least one memory block among the plurality of memory blocks;
   performing bad block marking on each of the plurality of memory blocks;
   generating bad block information, based on a result of the bad block marking;
   generating repair mapping information, based on the bad block information;
   backing up at least one of the bad block information and the repair mapping information into at least one of the plurality of memory blocks; and
   programming at least one of the bad block information and the repair mapping information in at least one of the plurality of memory blocks,
   wherein the performing of the bad block marking includes:
   detecting whether a defect has occurred in a selected memory block among the plurality of memory blocks; and
   updating data of a bad block latch among the plurality of bad block latches corresponding to the selected memory block, based on a result obtained by detecting whether the defect has occurred in the selected memory block, and
   wherein the data of the bad block latch indicates whether a corresponding memory block is a normal block or a bad block.

12. The method of claim 11, wherein the plurality of memory blocks are distinguished to belong to any one of a repair area, an extra area, and a main area,
   wherein, in the backing up of the at least one of the bad block information and the repair mapping information into at least one of the plurality of memory blocks, at least one of the bad block information and the repair mapping information is normal-programmed in a memory block belonging to the main area.

13. The method of claim 12, wherein the loading of the previous bad block marking result includes:
   reading the bad block information programmed in the main area; and
   storing, in the bad block latch, a bad block marking result included in the read bad block information.

14. The method of claim 11, wherein the plurality of memory blocks are distinguished to belong to any one of a repair area, an extra area, and a main area,
   wherein, in the programming of at least one of the bad block information and the repair mapping information in at least one of the plurality of memory blocks, at least one of the bad block information and the repair mapping information is CAM-programmed in a memory block belonging to the extra area.

15. A memory device comprising:
   a storage circuit configured to access a plurality of memory blocks included therein;
   a plurality of bad block latches, each of the plurality of bad block latches corresponding to a respective one of the plurality of memory blocks; and
   a control circuit configured to:
   perform a bad block marking operation to the memory blocks;
   generate bad block marking data representing a defective memory block among the memory blocks as a result of the bad block marking operation;
   perform a repair operation to the defective memory block based on the bad block marking data; and
   control the storage circuit to store the bad block marking data and repair mapping information, which is a result of the repair operation, into a normal one among the memory blocks,
   wherein a bad block latch of the plurality of bad block latches stores bit data indicating whether a memory block corresponding to the bad block latch is a normal block or a bad block, and
   the control circuit generates the bad block marking data by collecting bit data of the plurality of bad block latches.

* * * * *

UNITED STATES PATENT AND TRADEMARK OFFICE
CERTIFICATE OF CORRECTION

| | | |
|---|---|---|
| PATENT NO. | : 10,685,732 B2 | Page 1 of 1 |
| APPLICATION NO. | : 16/123514 | |
| DATED | : June 16, 2020 | |
| INVENTOR(S) | : Yong Hwan Hong and Byung Ryul Kim | |

It is certified that error appears in the above-identified patent and that said Letters Patent is hereby corrected as shown below:

On the Title Page

Change the title of invention as follows:
SEMICONDUCTOR MEMORY DEVICE AND OPERATING METHOD THEREOF Signed and Sealed this
Fourteenth Day of July, 2020

Andrei Iancu
*Director of the United States Patent and Trademark Office*